(12) United States Patent
Saito

(10) Patent No.: US 6,909,325 B2
(45) Date of Patent: Jun. 21, 2005

(54) MULTI-BAND AMPLIFIER

(75) Inventor: Noriaki Saito, Tokyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 62 days.

(21) Appl. No.: 10/695,042

(22) Filed: Oct. 28, 2003

(65) Prior Publication Data

US 2004/0130392 A1 Jul. 8, 2004

(30) Foreign Application Priority Data

Oct. 29, 2002 (JP) ........................................ 2002-313916

(51) Int. Cl.[7] .............................................. H03F 3/68
(52) U.S. Cl. ..................... 330/126; 330/252; 330/124 R
(58) Field of Search ............................ 330/126, 124 R, 330/252

(56) References Cited

U.S. PATENT DOCUMENTS

| | | | | |
|---|---|---|---|---|
| 4,220,974 A | * | 9/1980 | Craft ........................... | 348/735 |
| 5,339,458 A | * | 8/1994 | Nakatsuka et al. .......... | 455/333 |
| 5,715,532 A | * | 2/1998 | Sagawa et al. .............. | 455/333 |
| 6,496,545 B1 | * | 12/2002 | Liu ............................. | 375/301 |
| 2005/0005296 A1 | * | 1/2005 | Bargroff et al. ............... | 725/63 |

FOREIGN PATENT DOCUMENTS

JP        2000-124829 A       4/2000

* cited by examiner

*Primary Examiner*—Patricia Nguyen
(74) *Attorney, Agent, or Firm*—RatnerPrestia

(57) ABSTRACT

In a multi-band amplifier, provided are a first differential voltage-to-current converting circuit for converting a first frequency signal into a current and outputting the current, a second differential voltage-to-current converting circuit for converting a second frequency signal into a current and outputting the current, and a current transposition point connected in phase with and in parallel with output terminals of the first and second differential voltage-to-current converting circuits. A base-grounded amplifying circuit is connected in phase with and in series with an output terminal of the current transposition point. With this configuration, the circuit of a virtual ground point and the following of after voltage-to-current conversion can be provided in common by using a cascode amplifier as a low-noise amplifier, making it possible to constitute a multi-band amplifier minimized in the connection loss resulting from interconnection.

6 Claims, 5 Drawing Sheets

US 6,909,325 B2

MULTI-BAND AMPLIFIER

FIELD OF THE INVENTION

This invention relates to a multi-band amplifier for use mainly in various kinds of radio units, communication apparatuses, measuring instruments and so on.

BACKGROUND OF THE INVENTION

In the market of the cellular telephones in the GSM scheme as a de-facto standard, there is an increasing, indispensable need for those using the multi-band amplifiers, such as dual bands, in order for expanding the service area.

FIG. 1 is a schematic block connection diagram showing a configuration example of a conventional dual-band amplifier described in JP-A-2000-124829. The signal radio wave in a frequency band f1 is received by an f1-band input terminal 1000 and then removed of the interfering waves in the other band than f1 by a f1-band BPF (band-pass filter) 1002. Then, the signal is amplified to a desired level by an f1-band low-noise amplifier 1004 and inputted to one input terminal of a radio-frequency change-over switch 1006. On the other hand, the signal radio wave in a frequency band f2 is received by an f2-band input terminal 1001 and then removed of interfering waves in the other band than f2 by a f2-band BPF 1003. The signal is amplified to a desired level by an f2-band low-noise amplifier 1005 and inputted to the other input terminal of the radio-frequency change-over switch 1006. The radio-frequency change-over switch 1006 selects either one of the inputted f1-band or f2-band signal. The selected f1-band or f2-band signal is orthogonally demodulated by an orthogonal demodulating section 1007. In this manner, the orthogonal demodulating section 1007 is shared between the two frequency bands. In the case there exist three or more frequency bands, the orthogonal demodulating section 1007 is shared by a change-over selection at the radio-frequency change-over switch 1006.

In the configuration sharing an orthogonal demodulating section by using the radio-frequency change-over switch 1006, two of the low-noise amplifiers 1004, 1005 are required independently. Furthermore, loss is possibly caused by the radio-frequency change-over switch 1006.

SUMMARY OF THE INVENTION

Therefore, it is an object of the present invention to realize a low-loss multi-band amplifier by the utilization of a virtual ground point of a cascode amplifier.

An amplifier of the present invention comprising: a first differential voltage-to-current converting circuit for converting a first frequency signal into a current and outputting the current; a second differential voltage-to-current converting circuit for converting a second frequency signal into a current and outputting the current; a current transposition point connected in phase with and in parallel with output terminals of the first and second differential voltage-to-current converting circuits; and a base-grounded amplifying circuit connected in phase with and in series with an output terminal of the current transposition point. Due to this, a cascode amplifier is used as a low-noise amplifier to thereby make common the circuit of a virtual ground point and the following of after voltage-to-current conversion. This configuration makes it possible to constitute a multi-band amplifier minimized in the connection loss resulting from interconnection.

DESCRIPTION OF THE EXEMPLARY EMBODIMENT

Exemplary embodiments of the present invention are demonstrated hereinafter with reference to the accompanying drawings. Incidentally, the below embodiment exemplifies a dual-band amplifier as one kind of the multi-band amplifiers.

1. First Exemplary Embodiment

Figure 1:
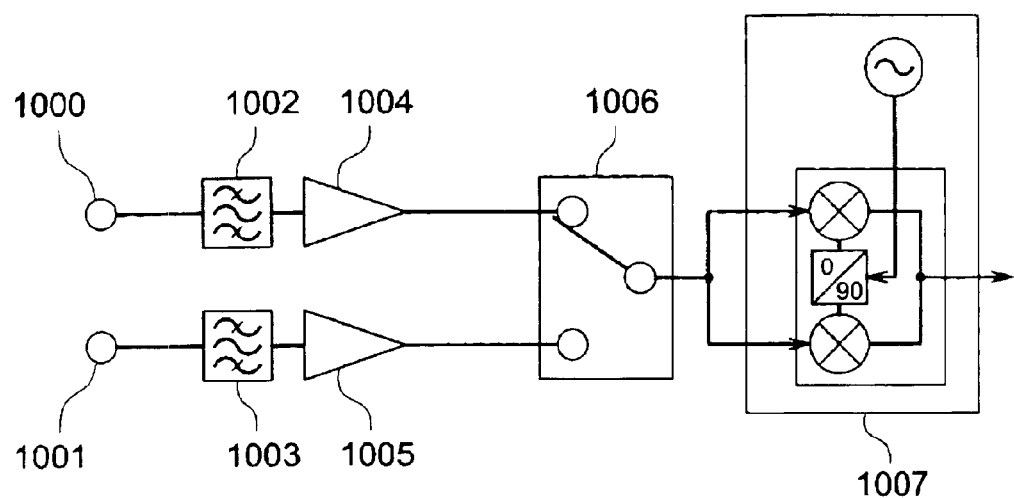
FIG. 1 is a block connection diagram of a conventional dual-band amplifier.

FIG. 1 shows a block connection diagram of a dual-band amplifier. In FIG. 1, the dual-band amplifier 100 is configured with a differential voltage-to-current converting circuit 110 corresponding to a signal in a frequency band f1, a differential voltage-to-current converting circuit 120 corresponding to a signal in a frequency band f2, an RF(Radio Frequency)-current transposition point 130 and a base-grounded amplifying circuit 140.

The differential voltage-to-current converting circuit 110 has an RF-voltage differential input terminal 111 and an RF-current differential output terminal 112. The radio-frequency voltage having a frequency f1 and inputted at the RF-voltage differential input terminal 111 is converted into a radio-frequency current in the differential voltage-to-current converting circuit 110 and then outputted to the RF-current differential output terminal 112. Likewise, the differential voltage-to-current converting circuit 120 has an RF-voltage differential input terminal 121 and an RF-voltage differential output terminal 122. The radio-frequency voltage having a frequency f2 and inputted at the RF-voltage differential input terminal 121 is converted into a radio-frequency current in the differential voltage-to-current converting circuit 120 and then outputted to the RF-current differential output terminal 122.

The base-grounded amplifying circuit 140 has base-grounded transistors 150, 160, base-ground capacitances 151, 161, a driving power source 143, a base-bias power source 144, a bias resistance 145, and load resistances 152, 153. The radio-frequency current inputted at the RF-current differential input terminal 141 is converted into a voltage and then outputted to the voltage differential output terminal 142. The RF-current transposition point 130 is connected in parallel with and in phase with the RF-current differential output terminals 112, 122, and furthermore connected in series with and in phase with the RF-current differential input terminal 141.

Now, explanation is made on the operation of the dual-band amplifier 100 configured as above.

In the case that a signal having a frequency f1, for example, is selected, the differential voltage-to-current converting circuit 110 turns ON and the differential voltage-to-current converting circuit 120 turns OFF. The radio-frequency signal f1 inputted at the RF-voltage differential input terminal 111 of the differential voltage-to-current converting circuit 110 is converted into a radio-frequency current by the differential voltage-to-current converting circuit 110 and then outputted to the RF-current differential output terminal 112. The outputted radio-frequency current is inputted through the RF-current transposition point 130 to the base-grounded amplifying circuit 140 at the RF-current differential input terminal 141. In the base-grounded amplifying circuit 140, the base-grounded transistors 150, 160 are properly biased at a common base thereof by the base-bias power source 144 and bias resistance 145, the base of which is RF-grounded by the base-ground capacitance 151, 161. The base-grounded transistor 150, 160 has an output connected with the load resistance 152, 153. Consequently, the radio-frequency current inputted to the RF-current differential input terminal 141 is voltage-converted by the base-grounded amplifying circuit 140 and then outputted as a voltage signal onto the RF-voltage differential output terminal 142.

Likewise, in the case that a signal having a frequency f2 is selected, the differential voltage-to-current converting circuit 120 turns ON and the differential voltage-to-current converting circuit 110 turns OFF. The radio-frequency signal f2 inputted at the RF-voltage differential input terminal 121 of the differential voltage-to-current converting circuit 120 is converted into a radio-frequency current by the differential voltage-to-current converting circuit 120 and then outputted to the RF-current differential output terminal 122. The outputted radio-frequency current is inputted through the RF-current transposition point 130 to the base-grounded amplifying circuit 140 at the RF-current differential input terminal 141. In this case, because the RF-current differential output terminal 122 is connected in parallel with and in phase with the RF-current differential output terminal 112 through the RF-current transposition point 130, the RF-current differential input terminal 141 can be inputted by a signal at a radio-frequency current in the same phase regardless of the frequency band f1, f2. The radio-frequency current inputted to the RF-current differential input terminal 141 is similarly voltage-converted by the base-grounded amplifying circuit 140 and then outputted as a voltage signal onto the RF-voltage differential output terminal 142.

In the above configuration, the RF-current differential output terminals 112, 122, the RF-current transposition point 130 and the RF-current differential input terminal 141 can all be considered as radio-frequency virtual ground points by the operation of the base-ground capacitances 151, 161. This can suppress to the minimum extent the influences of transmission lines and off-sided circuits, as compared to the conventional circuit extending the output with high impedance.

Figure 2:
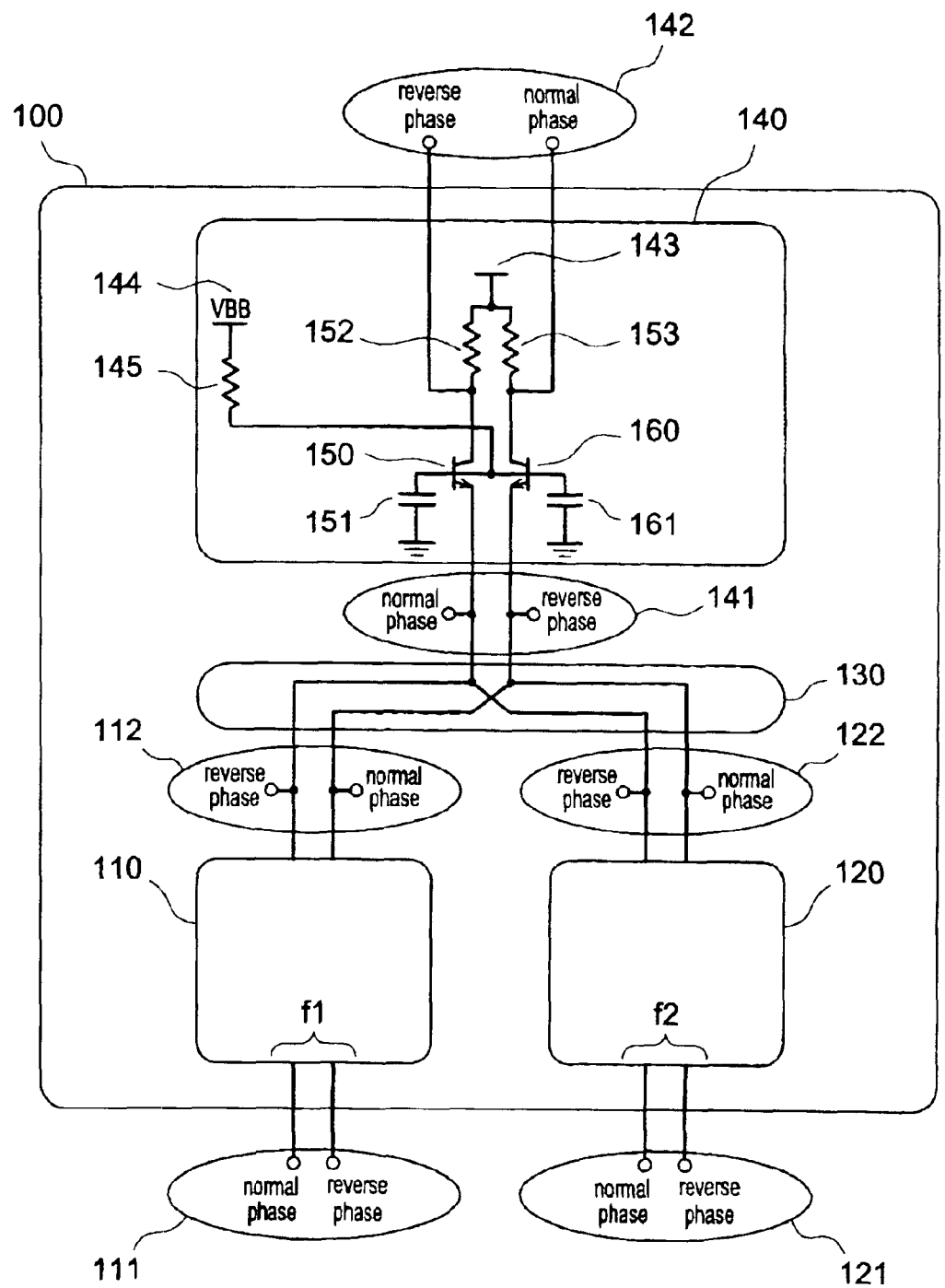
FIG. 2 is a block connection diagram of a dual-band amplifier in embodiment 1 of the present invention.

FIG. 2 shows a circuit diagram of the differential voltage-to-current converting circuit 111, 121. Although FIG. 2 exemplifies the differential voltage-to-current converting circuit 111, the differential voltage-to-current converting circuit 121 is quite same in configuration.

The differential voltage-to-current converting circuit 111 is configured with a direct-current bias circuit 250 and an RF operating section 240. The direct-current bias circuit 250 is configured with a power source 251, transistors 252, 253, resistances 254, 255, a reference current source 256, a current reference transistor 257, a base-current compensating transistor 258 and a bias resistance 261. The RF operating section 240 is configured with an RF differential-voltage differential input terminal 111, an RF current differential output terminal 112, transistors 210, 220 for voltage-to-current conversion, a feedback inductor 211 for improving the linearity without deteriorating the noise factor, and a feedback inductor 241 effective for improving the in-phase-noise removal ratio. The direct-current bias circuit 250 and the RF operating section 240 are connected together by RF blocking resistances 262, 263.

In the case the differential voltage-to-current converting circuit 111 is selected, a reference current flows to the reference current source 256. The reference current determines a current flowing through the current-reference transistor 257 by a current-mirror circuit constituted by the transistors 252, 253 and the resistances 254, 255. Meanwhile, the transistors 210, 220 of the RF operating section 240 constitute a current-mirror circuit cooperatively with the current-reference transistor 257. The base-current compensating transistor 258 makes a base-current compensation. Furthermore, the resistance ratio of the bias resistance 261 and RF blocking resistances 262, 263 is determined to a reciprocal of the current ratio of the reference-current transistor 257 and transistors 210, 220. By selecting such a ratio, the voltage drop due to the base current is made equal. This is effective for correcting for the hfe absolute variation of transistor. Meanwhile, because the RF blocking resistances 262, 263 prevent noise source from leaking from the current bias circuit 250 to the RF operating section 240, the RF operating section 240 can be set with a direct-current bias without deteriorating the noise factor.

Figure 3:
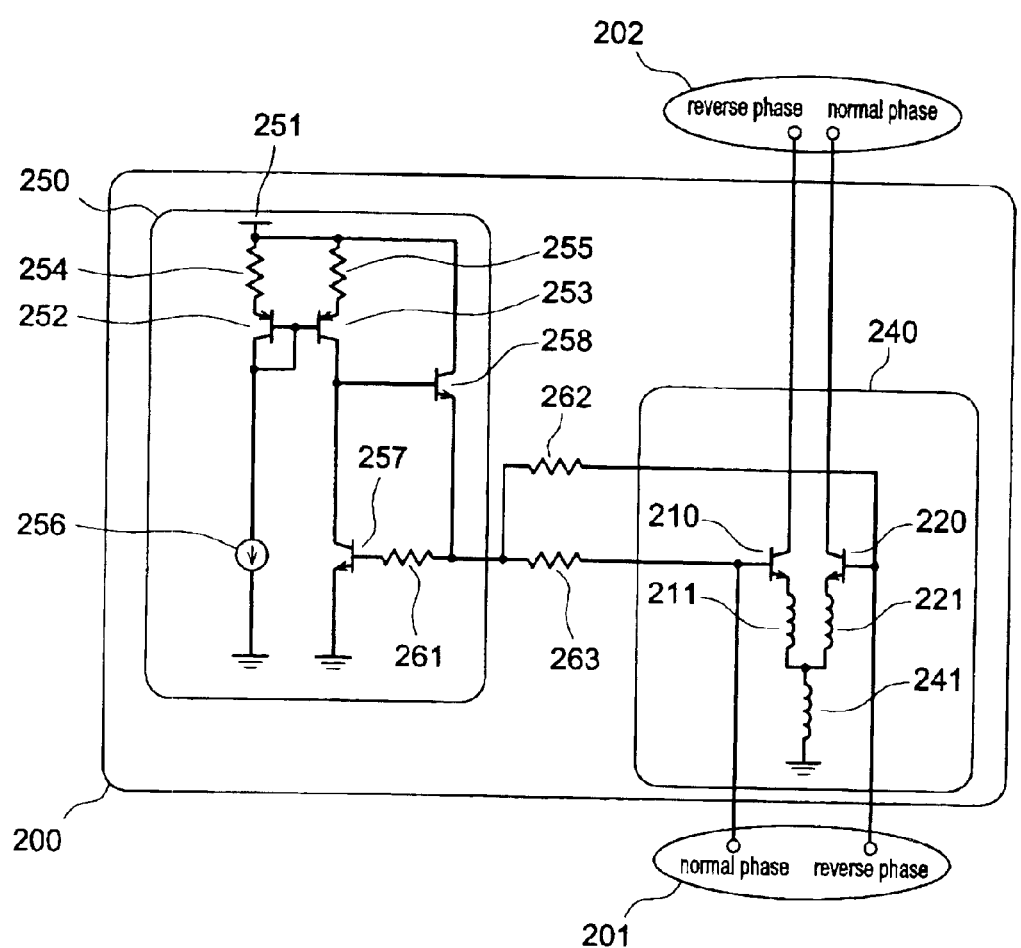
FIG. 3 is a circuit diagram of a differential voltage-to-current converting circuit used in the dual-band amplifier of FIG. 2.

FIG. 3 shows a connection diagram of the RF current transposition point 130. The RF current transposition point 130 is formed, for example, by the lower-level signal lines 300, 301 using a second level of a three-layered wiring of an integrated circuit and the upper-level signal lines 302, 303, 304, 305 using a third level thereof.

Where the frequency f1 is higher than the frequency f2, priority is placed on the wiring of from the RF-current differential output terminal 112 to the RF-current differential input terminal 141 through which the frequency f1 is to pass, thereby making a wiring in the upper level having less parasitic capacitance. The wiring, of from the RF-current differential output terminal 122 to the RF-current differential input terminal 141 through which the frequency f2 is to pass, uses the lower-level signal line 300 in the transposition point, thereby reducing the loss on the frequency f1 side to the minimum extent. Furthermore, by providing the lower-level signal line 301 with the same length as the length of the lower-level signal line 300, connection is possible also on the frequency f2 side without losing the balance. In this manner, the wiring on the frequency f1 side having higher frequency and greater loss is provided in the upper level lower in parasitic capacitance while the wiring on the frequency f2 side is provided in the lower level. This can configure a dual-band amplifier where the loss on the frequency f1 side is reduced to the minimum extent.

2. Second Exemplary Embodiment

Figure 4:
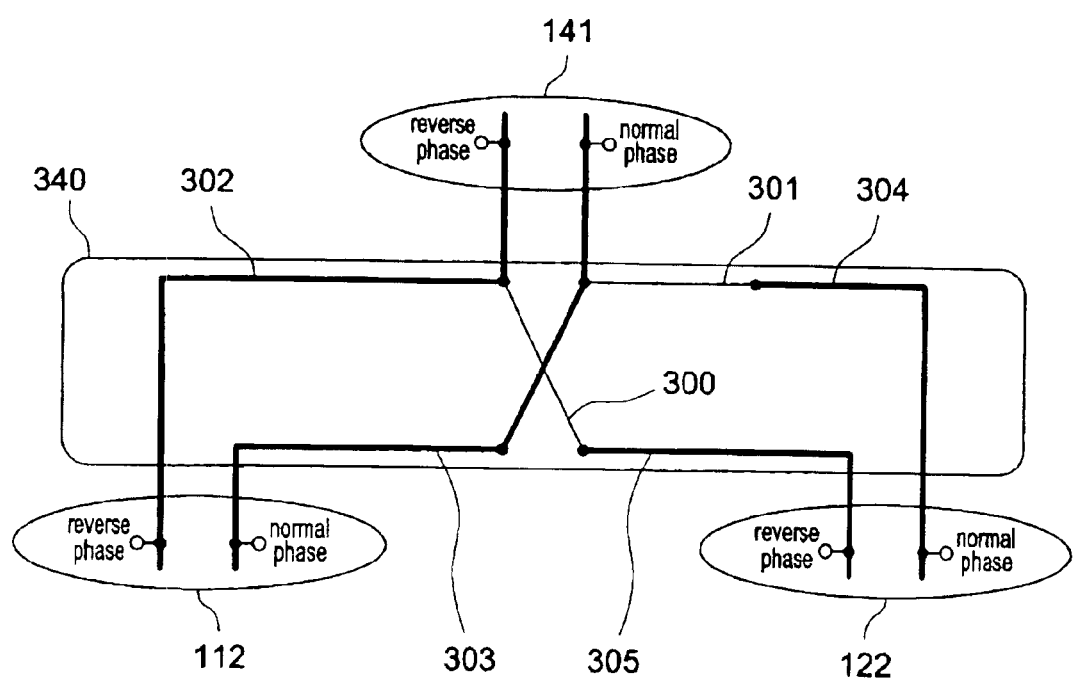
FIG. 4 is a connection diagram of an RF-current transposition point used in the dual-band amplifier of FIG. 2.
Figure 5:
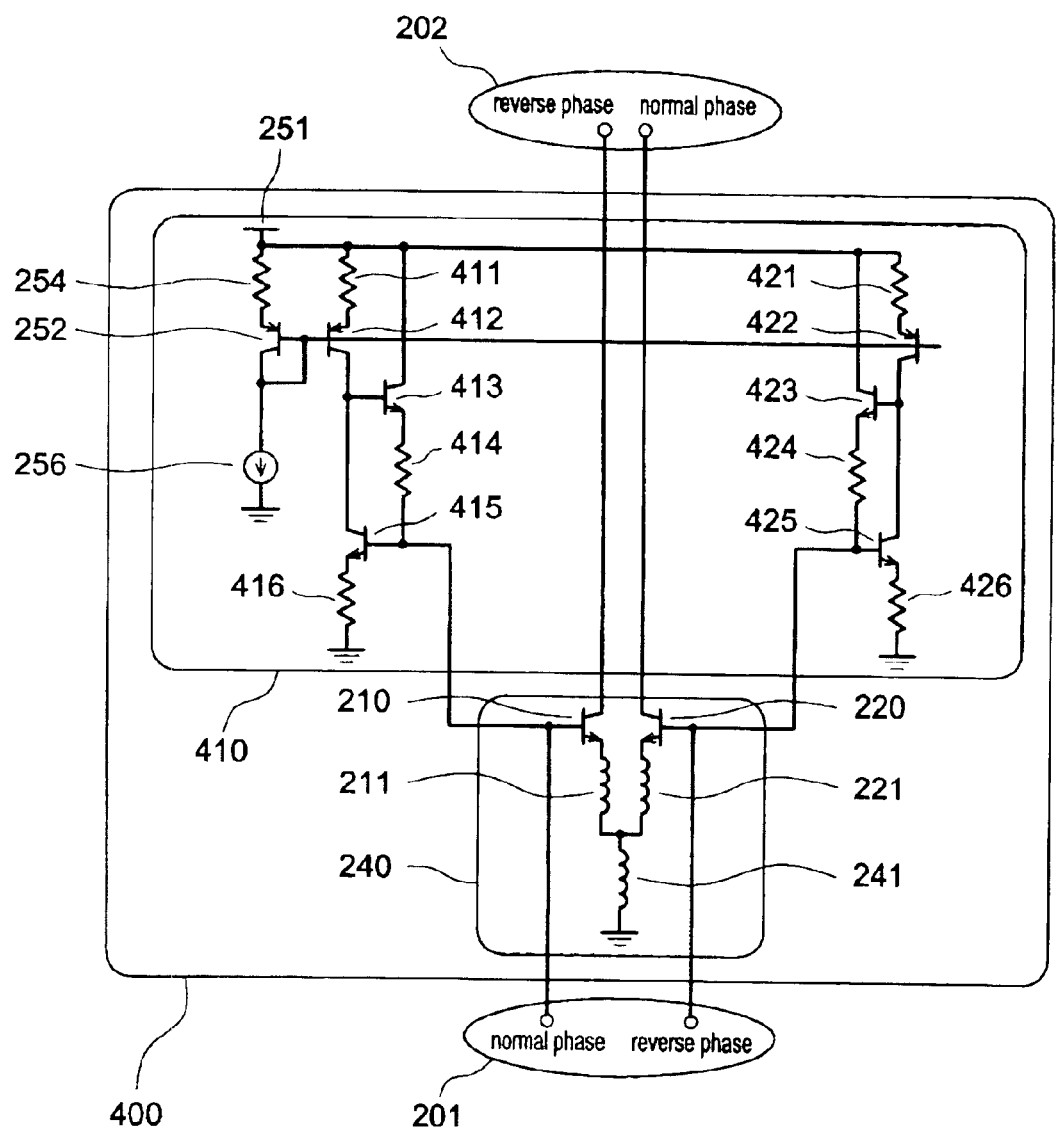
FIG. 5 is a circuit diagram of a differential voltage-to-current converting circuit used in the dual-band amplifier of embodiment 2 of the invention.

FIG. 5 shows a circuit diagram of a differential voltage-to-current converting circuit of an amplifier in embodiment 2 of the invention. The other parts than the differential voltage-to-current converting circuit of the amplifier are similar to those of FIGS. 2 and 4. Meanwhile, in the differential voltage-to-current converting circuit of FIG. 5, the same components as the constituent elements of the differential voltage-to-current converting circuit of FIG. 3 are attached with the same references, to omit explanations thereof. The difference from FIG. 3 lies in the configuration of a direct-current bias circuit 410.

The direct-current bias circuit 410 is configured with a power source 251, transistors 252, 412, 422, resistances 254, 411, 421, base-current compensating transistors 413, 423, current reference transistors 415, 425, RF blocking resistances 414, 424 and feedback resistances 416, 426.

In the case that the differential voltage-to-current converting circuit 111 is selected, a reference current flows to the reference current source 256. The reference current determines a current flowing to the current reference transistor 415, 425 by a current mirror circuit formed by the transistors 252, 412, 422, and the resistances 254, 411, 421. Meanwhile, the transistors 210, 220 of the RF operating section 240 configure current mirror circuits cooperatively with the current reference transistors 415, 425, respectively. The base-current compensating transistor 413, 423 makes a base-current compensation while the RF blocking resistance 414, 424 blocks a high frequency signal from flowing into the base-current compensating transistor 413, 423. Although a radio-frequency current flows to the current reference transistor 416, 426, the linearity can be enhanced by fully increasing the feedback resistance 416. Because there is no necessity of a series resistance between the current reference transistor 415, 425 and the transistor 210, 220, even in the case that there is large hfe relative variation between the transistors, the transistor 210, 220 can be secured with a current balance without causing a voltage-drop difference based on a series resistance.

According to this embodiment, when the transistors have large hfe relative variations, the current variations due to series resistances can be prevented, to prevent the balance deterioration between the differentials.

As described above, according to the invention, the RF current transposition point 130 is set up in the virtual ground point of a cascode amplifier, to parallel-connect the virtual ground point of cascode amplifier with an amplifier which is adjacent with respect to operating frequency band. Due to this, a dual-band amplifier can be configured which is reduced to the minimum extent the connection loss due to interconnection of the first and second differential voltage-to-current converting circuits 110, 120.

Incidentally, the above embodiments exemplified the dual-band amplifier having two differential voltage-to-current converting circuits. However, by providing differential voltage-to-current converting circuits three or more, the circuit can be shared as a multi-band amplifier at three or more adjacent frequency bands.

What is claimed is:

1. A multi-band amplifier comprising:
   a first differential voltage-to-current converting circuit for converting a first frequency signal into a current signal;
   a second differential voltage-to-current converting circuit for converting a second frequency signal into a current signal;
   a current transposition point connected in phase with and in parallel with output terminals of the first and second differential voltage-to-current converting circuits; and
   a base-grounded amplifying circuit connected in phase with and in series with an output terminal of the current transposition point.

2. A multi-band amplifier according to claim 1, wherein the base-grounded amplifying circuit includes a base-grounded transistor grounded at a base thereof by the base-grounded capacitance.

3. A multi-band amplifier according to claim 1, wherein each of the first and second differential voltage-to-current converting circuits includes an RF operating section having a differential amplifying circuit, a direct-current bias circuit formed by a current mirror circuit, and an RF blocking resistance inserted in series in a manner separating between the RF operating section and the direct-current bias circuit.

4. A multi-band amplifier according to claim 1, wherein each of the first and second differential voltage-to-current converting circuits includes an RF operating section having a differential amplifying circuit and a direct-current bias circuit formed by a current mirror circuit, to directly connect between the RF operating section and the direct-current bias circuit.

5. A multi-band amplifier according to claim 1, wherein the first differential voltage-to-current converting circuit includes a first RF-current differential output terminal, and the second differential voltage-to-current converting circuit includes a second RF-current differential output terminal and the current transposition point includes an RF-current differential input terminal whereby, in the case the first frequency is higher than the second frequency, the RF-current transposition point is connected with a transposition line by a wiring in an upper level at between the first RF-current differential output terminal and the RF-current differential input terminal of the RF-current transposition point and by a wiring in a lower level at between the second RF-current differential output terminal and the RF-current differential input terminal of the RF-current transposition point.

6. A multi-band amplifier according to claim 1, further comprising one or a plurality of differential voltage-to-current converting circuits for converting a signal having a frequency different from the first and second frequencies into a current signal.

* * * * *